United States Patent [19]

Hsieh et al.

[11] Patent Number: 4,780,396
[45] Date of Patent: Oct. 25, 1988

[54] ORGANIC SOLVENT FREE DEVELOPER COMPOSITIONS FOR LITHOGRAPHIC PLATES HAVING NEUTRAL PH COMPRISING A LITHIUM AND POTASSIUM SALT AND AN ANIONIC SURFACTANT

[75] Inventors: Shane Hsieh, Bridgewater; Wayne A. Mitchell, Bound Brook, both of N.J.

[73] Assignee: Hoechst Celanese Corporation, Somerville, N.J.

[21] Appl. No.: 14,969

[22] Filed: Feb. 17, 1987

[51] Int. Cl.$^4$ ............................................... G03C 5/18
[52] U.S. Cl. ...................................... 430/331; 430/309
[58] Field of Search ................................ 430/331, 309

[56] References Cited

U.S. PATENT DOCUMENTS

| | | |
|---|---|---|
| 3,891,439 | 6/1975 | Katz et al. ............................ 430/331 |
| 4,147,545 | 4/1979 | Rowe et al. .......................... 430/331 |
| 4,350,756 | 9/1982 | Burch et al. ......................... 430/331 |
| 4,436,807 | 3/1984 | Walls ................................... 430/331 |
| 4,692,397 | 9/1987 | Liu ...................................... 430/331 |

Primary Examiner—Paul R. Michl
Assistant Examiner—Patrick A. Doody
Attorney, Agent, or Firm—Richard S. Roberts

[57] ABSTRACT

An organic solvent free developer composition having a pH in the range of from about 6.5 to about 7.5 comprising in admixture:

(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and (b) from about 0.1% to about 30% by weight of the developer of one or more components selected from the group consisting of lithium salts of hydroxy, aryl and alkyl carboxylic acids; and (c) from about 0.1% to about 30% by weight of the developer of one or more compounds selected from the group consisting of potassium salts of hydroxy, aryl and alkyl carboxylic acids; and (d) an optional compatible organic or inorganic acid or base in an amount sufficient to adjust the pH of the developer composition into the range of from about 6.5 to about 7.5; and (e) an optional anti-foam component in an amount of from about 0.02 to about 0.05% by weight of the developer; and (f) sufficient water to formulate an effective developer.

21 Claims, No Drawings

ORGANIC SOLVENT FREE DEVELOPER COMPOSITIONS FOR LITHOGRAPHIC PLATES HAVING NEUTRAL PH COMPRISING A LITHIUM AND POTASSIUM SALT AND AN ANIONIC SURFACTANT

BACKGROUND OF THE INVENTION

The present invention relates to developer compositions for photographic elements comprising photosensitive coatings on substrates, or more particularly to developer oompositions for removing the non-image areas of exposed, usually negative working lithographic printing plates.

In the past, various methods of developing printing plates have been employed. Such methods include the use of compositions containing organic solvents, surfactants, salts, acids and other art recognized materials in solution.

It is most desirable to have a developer composition which is capable of completing development in a short period of time. The oleophilic image areas of the printing plate should be ink receptive and water repellant whereas the hydrophilic non-image areas should be water receptive and greasy ink repellant.

The proper selection of the solvent in a developer solution is very important. If the selected solvent in a developer solution is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, nonimage areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

To provide a partial solution to the problem, volatile solvents are used in many prior art developer compositions. It is expected that the use of such volatile solvents in the developer solution will prevent tackiness in the image by permitting rapid evaporation. However, use of large amounts of water miscible low boiling point solvents for example, as used in the developer described in U.S. Pat. No. 3,954,472, produces the problems of working sanitation, hazards due to low flash point, and pollution. A reduction of the concentration of these water miscible low boiling point solvents helps to minimize these problems in the working environment, however, the speed of development will be adversely affected. Also the tackiness of the coatings is reduced but not completely eliminated.

To improve the speed of development of developer solutions containing a lower concentration of low boiling points solvents, an adjuvant organic solvent is sometime added. Unfortunately, such developers suffer from several drawbacks including: toxicity, developer instability, odor or inability to effectively clean out unwanted background non-image areas.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabiiizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419.

Typical prior art developing compositions are described in U.S. Pat. Nos. 2,754,279; 4,381,340 and German OLS No.2,216,419.

Attempts have been made in the art to eliminate the low boiling solvent in the developer solution. U.S. Ser. No. 762,089 filed Aug. 2, 1985 describes a method to prepare a printing plate using polyvinyl alcohol-/acetate/acetal resins which can tben be developed with aqueous solutions of salts and surfactants which are essentially neutral. These other aqeuous solutions have been generally unsatisfactory due to foaming in processing equipment, salt precipitation through water evaporation, insufficient developing capacity, and the presence of environment polluting phosphates. Others have been substantially acidic or basic, thereby making handling and disposal difficult.

The present invention improves upon the aforementioned drawbacks of other lithographic developers.

It is an object of this invention to provide a developer for lithographic printing plates which will enable the operator to prepare a plate with a developer free from organic solvents, and having a substantially neutral pH while simultaneously achieving commerically acceptable removal of non-imaged areas.

SUMMARY OF THE INVENTION

The invention provides an organic solvent free developer composition having a pH in the range of from about 6.5 to about 7.5 comprising in admixture:

(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and (b) from about 0.1% to about 30% by weight of the developer of one or more components selected from the group consisting of lithium salts of hydroxy, aryl and alkyl carboxylic acids; and (c) from about 0.1% to about 30% by weight of the developer of one or more compounds selected from the group consisting of potassium salts of hydroxy, aryl and alkyl carboxylic acids; and (d) an optional compatible organic or inorganic acid or base in an amount sufficient to adjust the pH of the developer composition into the range of from about 6.5 to about 7.5; and (e) an optional anti-foam component in an amount of up to about 0.05% by weight of the developer; and (f) sufficient water to formulate an effective developer.

The invention further provides a method for preparing a photographic element which comprises imagewise exposing a photographic element comprising a light sensitive negative working or positive working photographic composition disposed on a substrate with sufficient actinic radiation to form a latent image and then removing the non-image areas of said exposed element with an organic solvent tree developer composition having a pH in the range of from about 6.5 to about 7.5 comprising in admixture:

(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and (b) from about 0.1% to about 30% by weight of the developer of one or more components selected from the group consisting of lithium salts of hydroxy, aryl and alkyl carboxylic acids; and (c) from about 0.1% to about 3% by weight of the developer of one or more compounds selected from the group consisting of potassium salts of hydroxy, aryl and alkyl carboxylic acids; and (d) an optional compatible organic or inorganic acid or base in an amount sufficient to adjust the pH of the developer composition into the range of from about 6.5 to about 7.5; and (e) an optional anti-foam component in an amount of up to about 0.05% by weight of the developer; and (f) sufficient water to formulate an effective developer.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3303 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt or photopolymer containing composition. Such compositions may also contain binding resins, such as polyvinyl formal resins, colorants, acid stabilizers, surfactants, exposure indicators or other art recognized ingredients.

The photosensitive sheet material is then exposed to a suitable radiation source through a mask or transparency, and the exposed sheet then developed for removal of the non-image photosensitive materials.

The photosensitive coating mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392. All of the foregoing patents are incorporated herein by reference.

A most preferred diazonium salt is the polycondensation product of 3-methoxy-4-diazo-diphenyl amine sulfate and 4,4'-bis-methoxy methyl-diphenyl ether, precipitated as the mesitylene sulfonate, as taught in U.S. Pat. No. 3,849,392.

Suitable photopolymerizable compositions are also well known to the skilled artisan.

The present invention provides a method for developing such exposed photosensitive elements by contacting them, to remove the non-image areas, using a developer which contains the aforementioned ingredients in an aqueous mixture. The mixture has a pH which is essentially neutral, that is, in the range of from about 6.5 to about 7.5, more preferably from about 6.5 to about 7.2 and most preferably from about 7.0 to about 7.2.

The developer contains an alkyl sulfate surfactant component which does not substantially foam when used in the developer of this invention. In the preferred embodiment this component is from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate. A more preferred range is from about 0.5% to about 15.0% and most preferably from about 1.0% to about 8.0%.

The developer also contains from about 0.1% to about 30% by weight of the developer of one or more lithium salts of hydroxy, aryl or alkyl carboxylic acid. A more preferred range is from about 1% to about 20% and most preferably from about 5% to about 10%. A typical example includes lithium benzoate, or the requisite salt may be formed by adding lithium hydroxide to an aqueous solution of the selected carboxylic acid.

The developer further contains from about 0.1% to about 30% by weight of the developer of one or more compounds selected from the group consisting of potassium salts of hydroxy, aryl or alkyl carboxylic acids. A more preferred range is from about 0.5% to about 20% and most preferably from about 1% to about 10%. Typical examples of the foregoing include potassium sorbate, potassium citrate, potassium succinate, and potassium maleate. Such are either available commerically or generated by adding potassium hydroxide to a solution of the selected carboxylic acid. In the preferred embodiment the ratio of lithium salt to potassium salt is from about 1:1 to 1: more than 1. Carboxylic acids useful for forming the lithium and potassium salts of this invention non-exclusively include sorbic acid, succinic acid, benzoic acid, D.L. malic acid, tartaric acid and citric acid.

The developer also may optionally contain a compatible acid or base component in an amount to is an amount to adjust the pH of the developer into the desired range. Examples of the foregoing non-exclusively include D.L-glyceric acid, malic acid, tartaric acid, citric acid, galactanic acid, leuritic acid and 8, 9, 15-trihydroxyppalmitic acid, and alkali metal hydroxides.

In the preferred embodiment, the developer of the present invention preferably contains optional minor amounts of a conventional anti-foam component which aids in processing of the printing plate. This component, when it is used is preferably present in an amount of from about 0.02 to about 0.05% by weight of the developer.

In operation, the developer solution is often employed in a processing machine wherein the solution may become contaminated by removed printing plate components. Such may cause an undesired pH fluctuation to the developer over time. It is therefore desired to provide the developer with an optional buffering component. In the preferred embodiment such prevent a pH fluctuation of more than about plus or minus two pH units from the pH of the uncontaminated developer solution. Non-exclusive examples of such are the alkali metal salts of citric, phosphoric, boric, barbituric, succinic and phthalic acids, as well as triethanol amine and tris (hydroxy methyl) amino ethane. Although the alkali metal phosphates do function as effective buffers, they are not preferred for environmental reasons. Sodium citrate is the most preferred buffer. Such are present in an amount sufficient to control fluctuation to plus or minus two pH units.

One preferred anti-foam agent is Dow DB-31 which is a silicone type anti-foam. The developer then contains sulficient water to formulate an effective developer. Optionally, one may add sufficient minor amounts of a compatible acid or base to adjust the pH of the developer into the desired range. The developer may also contain optional film formers. The developer is capable of substantially completely removing the non-image areas of a photographic element in about 2 minutes or less while simultaneously removing substantially none of the image areas. Substantially none of the material comprising said non-image areas is re-deposited back onto said photographic element.

The following non-limiting examples serve to illustrate the invention.

EXAMPLE 1

An ENCO®A-30 negative working printing plate available commmercially from American Hoechst Corporation is imagewise exposed to actinic radiation in a manner well known to the skilled artisan. The thusly exposed plate is then washed with the following developer composition:

|  | Weight % |
| --- | --- |
| Water | 85.88 |
| Sodium Octyl Sulfate | 3.00 |
| Lithium Benzoate | 6.00 |
| Potassium Sorbate | 4.00 |
| Sodium Citrate | 1.00 |
| Citric Acid | 0.10 |
| DB-31 | 0.02 |

The plate develops cleanly in a customary developing-machine without noticeable background scumming or re-deposit of removed plate coatings.

EXAMPLE 2

Example 1 is repeated with the following developer composition:

|  | Weight % |
| --- | --- |
| Water | 85.98 |
| Sodium Octyl Sulfate | 3.00 |
| Lithium Benzoate | 7.00 |
| Potassium Malate | 4.00 |
| DB-31 | 0.02 |

Similar results are noted.

EXAMPLE 3

Example 1 is repeated with the following developer composition:

|  | Weight % |
| --- | --- |
| Water | 85.48 |
| Sodium Octyl Sulfate | 3.50 |
| Lithium Benzoate | 7.50 |
| Potassium Benzoate | 2.50 |
| Sodium 2-hydroxybutyrate | 1.00 |
| DB-31 | 0.02 |

Similar results are noted.

EXAMPLE 4

Example 1 is repeated with the following developer composition:

|  | Weight % |
| --- | --- |
| DI Water | 87.48 |
| Lithium Succinate | 7.50 |
| Succinic Acid | 1.00 |
| Potassium Hydroxide | 1.00 |
| Sodium Octyl Sulfate | 3.00 |
| DB-31 | 0.02 |

Similar results are noted.

EXAMPLE 5

Example 1 is repeated wtih the following developer composition:

|  | Weight % |
| --- | --- |
| DI Water | 87.38 |
| Tartaric Acid | 5.75 |
| Lithium Hydroxide | 2.58 |
| Potassium Hydroxide | 1.27 |
| Sodium Octyl Sulfate | 3.00 |
| DB-31 | 0.02 |

Similar results are noted.

EXAMPLE 6

Example 1 repeated with the following developer composition:

|  | Weight % |
| --- | --- |
| DI Water | 86.89 |
| Lithium Citrate | 7.50 |
| Potassium Citrate | 2.50 |
| Citric Acid | 0.09 |
| Sodium Octyl Sulfate | 3.00 |
| DB-31 | 0.02 |

Similar results are noted.

EXAMPLE 7

Example 1 is repeated with the following developer composition:

|  | Weight % |
|---|---|
| DI Water | 87.28 |
| Lithium Benzoate | 7.50 |
| Potassium Citrate | 2.20 |
| Sodium Octyl Sulfate | 3.00 |
| Hydrochloric Acid | 2 drops |
| DB-31 | 0.02 |

Similar results are noted.

EXAMPLE 8

Example 1 is repeated with the following developer composition:

|  | Weight % |
|---|---|
| Water | 86.74 |
| Lithium Benzoate | 7.50 |
| Sodium Octyl Sulfate | 3.00 |
| Potassium Hydroxide | 1.38 |
| Citric Acid, Anhydrous | 1.35 |
| DB-31 | 0.03 |

Similar results are noted.

EXAMPLE 9

Example 1 is repeated with the following developer composition:

|  | Weight % |
|---|---|
| DI Water | 86.98 |
| Lithium Benzoate | 7.50 |
| Potassium Benzoate | 2.50 |
| Sodium Octyl Sulfate | 3.00 |
| Hydrochloric Acid | 2 drops |
| DB-31 | 0.02 |

Similar results are noted.

EXAMPLE 10

Example 1 is repeated with the following developer composition:

|  | Weight % |
|---|---|
| DI Water | 86.48 |
| Lithium Benzoate | 7.50 |
| Potassium Hydroxide | 1.50 |
| D.L. - Malic Acid | 1.50 |
| Sodium Octyl Sulfate | 3.00 |
| DB-31 | 0.02 |

Similar results are noted.

EXAMPLE 11

Example 1 is repeated with the following developer composition:

|  | Weight % |
|---|---|
| DI Water | 87.23 |
| D.L. - Malic Acid | 5.75 |
| Lithium Hydroxide | 2.50 |
| Potassium Hydroxide | 1.50 |
| Sodium Octyl Sulfate | 3.00 |

-continued

|  | Weight % |
|---|---|
| DB-31 | 0.02 |

Similar results are noted.

What is claimed:

1. An organic solvent free developer composition having a pH in the range of from about 6.5 to about 7.5 consisting essentially of in admixture:
   (a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and
   (b) from about 0.1% to about 30% by weight of the developer of one or more components selected from the group consisting of lithium salts of hydroxy, aryl and alkyl carboxylic acids; and
   (c) from about 0.1% to about 30% by weight of the developer of one or more compounds selected from the group consisting of potassium salts of hydroxy, aryl and alkyl carboxylic acids; and
   (d) an optional compatible organic or inorganic acid or base in an amount sufficient to adjust the pH of the developer composition into the range of from about 6.5 to about 7.5; and
   (e) an optional anti-foam component in an amount of from about 0.02 to about 0.05% by weight of the developer; and
   (f) an optional buffering component in an amount sufficient to maintain the developer in the above range, plus or minus two pH units; and
   (g) sufficient water to formulate an effective developer.

2. The developer of claim 1 wherein component (a) comprises sodium octyl sulfate.

3. The developer of claim 1 wherein component (b) comprises lithium benzoate.

4. The developer of claim 1 wherein component (c) comprises potassium sorbate.

5. The developer of claim 1 wherein component (d) comprises citric acid.

6. The developer of claim 1 wherein said component (f) comprises one or more compounds selected from the group consisting of alkali metal salts of citric, phosphoric, boric, barbituric, succinic and phthalic acids, as well as triethanol amine and tris (hydroxy methyl) amino ethane.

7. The developer of claim 1 wherein said component (f) comprises sodium citrate.

8. The developer of claim 1 wherein component (a) is present in an amount of from about 0.5% to about 15.0% based on the weight of the developer composition.

9. The developer of claim 1 wherein component (b) is present in an amount of from about 1.0% to about 20.0% based on the weight of the developer composition.

10. The developer of claim 1 wherein component (c) is present in an amount of from about 0.5% to about 20.0% based on the weight of the developer composition.

11. The developer of claim 1 wherein said component (a) is present in an amount of from about 1.0% to about 8.0%, component (b) is present in an amount of from about 5.0% to about 10.0%, component (c) is present in an amount of from about 1.0% about 10% based on the weight of the developer.

12. The developer of claim 1 wherein said component (a) comprises sodium octyl sulfate and is present in an amount of from about 1.0% to about 8.0%, component (b) comprises lithium benzoate and is present in an amount of from about 5.0% to about 10.0%, component (c) comprises potassium sorbate and is present in an amount of from about 1.0% to about 10%, and component (d) comprises citric acid, said amounts based on the weight of the developer.

13. A method of treating a photographic element which comprises imagewise exposing a positive working or negative working photographic element. to sufficient actinic radiation to form a latent image thereon, and then removing the non-image portions thereof with: an organic solvent free developer composition having a pH in the range of from about 6.5 to about 7.5 consisting essentially of in admixture:
(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and
(b) from about 0.1% to about 30% by weight of the developer of one or more components selected from tbe group consisting of lithium salts of hydroxy, aryl and alkyl carboxylic acids; and
(c) from about 0.1% to about 30% by weight of the developer of one or more compounds selected from the group consisting of potassium salts of hydroxy, aryl and alkyl carboxylic acids; and
(d) an optional compatible organic or inorganic acid or base in an amount sufficient to adjust the pH of the developer composition into the range of from about 6.5 to about 7.5; and
(e) an optional anti-foam component in an amount of from about 0.02 to about 0.05% by weight of the developer; and
(f) an optional buffering component in an amount sufficient to maintain the developer in the above range, plus or minus two pH units; and
(g) sufficient water to formulate an effective developer.

14. The method of claim 13 wherein component (a) comprises sodium octyl sulfate.

15. The method of claim 13 wherein component (b) comprises lithium benzoate.

16. The method of claim 13 wherein component (c) comprises potassium sorbate.

17. The method of claim 13 wherein component (d) comprises citric acid.

18. The method of claim 13 wherein said component (f) comprises one or more compounds selected from the group consisting of alkali metal salts of citric, phosphoric, boric, barituric, succinic and phthalic acids, as well as triethanol amine and tris (hydroxy methyl) amino ethane.

19. Tbe method of claim 13 wherein said component (f) comprises sodium citrate.

20. The method of claim 13 wherein said component (a) is present in an amount of from about 1.0% to about 8.0%, component (b) is present in an amount of from about 5.0% to about 10.0%, component (c) is present in an amount of from about 1.0% to about 10% based on the weight of the developer.

21. The method of claim 113 wherein said component (a) comprises sodium octyl sulfate and is present in an amount of from about 1.0% to about 8.0%, component (b) comprises lithium benzoate and is present in an amount of from about 5.0% to about 10.0%, component (c) comprises potassium sorbate and is present in an amount of from about 1.0% to about 10%, and component (d) comprises citric acid, said amounts based on the weight of the developer.

* * * * *